(12) United States Patent
Shi et al.

(10) Patent No.: US 12,174,234 B1
(45) Date of Patent: Dec. 24, 2024

(54) SYSTEM AND METHOD FOR MEASURING RESONANCE FREQUENCIES OF QUANTUM SENSOR BASED ON MULTI-PHOTON EXCITATION

(71) Applicant: Guangdong Provincial Institute of Metrology(South China National Centre of Metrology), Guangzhou (CN)

(72) Inventors: Xinrong Shi, Guangzhou (CN); Zhifang Chang, Guangzhou (CN); Xiaojing Li, Guangzhou (CN); Xudong Luo, Guangzhou (CN)

(73) Assignee: Guangdong Provincial institute of Metrology, Guangzhou (CN)

( * ) Notice: Subject to any disclaimer, the term of this patent is extended or adjusted under 35 U.S.C. 154(b) by 0 days.

(21) Appl. No.: 18/601,029

(22) Filed: Mar. 11, 2024

(30) Foreign Application Priority Data

Oct. 31, 2023 (CN) .......................... 2023114245766

(51) Int. Cl.
*G01R 29/08* (2006.01)
*G01R 23/02* (2006.01)

(52) U.S. Cl.
CPC ......... *G01R 29/0892* (2013.01); *G01R 23/02* (2013.01); *G01R 29/0885* (2013.01)

(58) Field of Classification Search
CPC . G01R 29/0892; G01R 23/02; G01R 29/0885
USPC ........................................................ 324/200
See application file for complete search history.

(56) References Cited

U.S. PATENT DOCUMENTS

| | | | | |
|---|---|---|---|---|
| 10,979,147 B2 * | 4/2021 | Gordon | ................ | H04B 10/503 |
| 2016/0363617 A1 * | 12/2016 | Anderson | .......... | G01R 29/0885 |
| 2022/0196716 A1 * | 6/2022 | Anderson | .............. | G01R 29/10 |

FOREIGN PATENT DOCUMENTS

| | | | |
|---|---|---|---|
| CN | 107121593 A | * | 9/2017 |
| CN | 110401492 A | | 11/2019 |
| CN | 113238097 A | | 8/2021 |
| CN | 115825592 A | * | 3/2023 |
| CN | 116298551 A | | 6/2023 |
| CN | 117054761 A | * | 11/2023 |
| CN | 117147965 B | * | 1/2024 |
| CN | 117388571 A | * | 1/2024 |

* cited by examiner

*Primary Examiner* — Christopher P McAndrew

(57) ABSTRACT

The present disclosure provides a system and method for measuring resonance frequencies of a quantum sensor based on multi-photon excitation. The system includes a probe laser module, a coupling laser module, a quantum sensor, a fast measurement module, an experimental signal source, and a measurement and calculation module. The experimental signal source directly faces the quantum sensor, and is configured to transmit a RF electromagnetic signal to the quantum sensor. The quantum sensor includes a closed glass cavity. An alkali metal atomic vapor is enclosed in the glass cavity. The probe laser module is connected to one side of the quantum sensor, and the coupling laser module is connected to the other side of the quantum sensor through the fast measurement module.

9 Claims, 2 Drawing Sheets

SYSTEM AND METHOD FOR MEASURING RESONANCE FREQUENCIES OF QUANTUM SENSOR BASED ON MULTI-PHOTON EXCITATION

CROSS-REFERENCE TO RELATED APPLICATION

This application claims priority to CN patent application No. 202311424576.6, filed on Oct. 31, 2023, the entire content of which is incorporated herein by reference for all purposes.

TECHNICAL FIELD

The present disclosure relates to the field of precision measurement technologies, and in particular, to a system and method for measuring resonance frequencies of a quantum sensor based on multi-photon excitation.

BACKGROUND

In recent years, application of quantum sensing systems in the field of electromagnetic signal measurement has received more attention. For example, the Chinese Patent No. CN202310573045.7 discloses a plug-and-play quantum sensing electromagnetic wave measurement system based on modularization, which implements precision measurement of a microwave electric field based on electromagnetically induced transparency (EIT) effect of Rydberg atoms and Autler-Townes splitting of probe microwaves.

A quantum sensor, the core component of the quantum sensing measurement system, determines reliability and precision of the final measurement data. Therefore, how to precisely measure the performance of a quantum sensor is of great importance for quantum sensing measurement. Precision measurement of resonance frequencies of a quantum sensor provides reliable evidence for whether a gain medium (alkali metal atomic vapor) in the quantum sensor effectively acts on electromagnetic waves with the same frequency, and also provides a direct proof and basis for whether subsequent measurement data of electromagnetic wave strength is reliable.

Currently, a relatively coarse measurement method is used for measuring resonance frequencies of the quantum sensor. To be specific, an electromagnetic wave frequency near a theoretical value is calculated through frequency sweep at specific electric field strength, to obtain approximate frequency data to fit and determine resonance frequencies of the quantum sensor. This measurement method has limited precision and is difficult to be scientifically reproduced. As a result, the reliability and repeatability of a measurement result cannot be ensured in subsequent measurement.

In conclusion, an existing system and method for measuring resonance frequencies of a quantum sensor have some disadvantages. Optical links are complex, operation procedures are cumbersome, and measurement efficiency is low. In addition, scientific and quantitative measurement and evaluation cannot be implemented for the quantum sensor, and scientific judgment cannot be provided for measurement results.

SUMMARY

An object of the present disclosure is to provide a system and method for measuring resonance frequencies of a quantum sensor based on multi-photon excitation to resolve disadvantages of an existing system and method for measuring resonance frequencies of a quantum sensor, for example, low measurement efficiency and incapability of implementing scientific and quantitative measurement and evaluation.

To achieve the foregoing objectives, the following technical solutions are used in the present disclosure.

According to a first aspect, embodiments of the present disclosure provide a system for measuring resonance frequencies of a quantum sensor based on multi-photon excitation. The system includes a probe laser module, a coupling laser module, a quantum sensor, a fast measurement module, an experimental signal source, and a measurement and calculation module.

In some embodiments, the experimental signal source directly radiates the quantum sensor, and is configured to transmit a radio-frequency (RF) electromagnetic signal to the quantum sensor.

In some embodiments, the quantum sensor includes a closed glass cavity. An alkali metal atomic vapor is enclosed in the glass cavity. The probe laser module is connected to one side of the quantum sensor, and the coupling laser module is connected to the other side of the quantum sensor through the fast measurement module, the other side being opposite to the one side.

In some embodiments, the coupling laser module is configured to: emit a coupling laser at a stable frequency, and transmit the coupling laser to the side of the quantum sensor through the fast measurement module.

In some embodiments, the probe laser module is configured to: emit a probe laser at a stable frequency, and transmit the probe laser to the other side of the quantum sensor.

In some embodiments, the quantum sensor is configured to: apply the probe laser and the coupling laser to the atomic vapor to generate an EIT signal, which can sense the RF electromagnetic signal emitted by the experimental signal source. The RF electromagnetic signals induce a splitting of the EIT signals, resulting in the emergence of two distinct peaks.

In some embodiments, the fast measurement module is configured to receive the EIT signal generated in the quantum sensor, to obtain a frequency gap between two distinct peaks of the EIT signal corresponding to different frequencies, a splitting being induced by the RF electromagnetic signal to result in the emergence of the two distinct peaks.

In some embodiments, the measurement and calculation module is connected to the fast measurement module, and is configured to: obtain an experimental resonance frequency of the quantum sensor by using an algorithm based on the frequency gap measured by the fast measurement module and field strength of the RF electromagnetic signal transmitted by the experimental signal source, and perform measurement on the quantum sensor by comparing a theoretical resonance frequency and the experimental resonance frequency of the quantum sensor.

In some embodiments, the fast measurement module is further configured to perform beam shaping and polarization-maintaining functions on the coupling laser in a process of transmitting the coupling laser.

In some embodiments, the fast measurement module includes a half-wave plate, a dichroic mirror, a reflecting mirror, a photoelectric transducer, and a signal measurement apparatus that are sequentially disposed. The signal measurement apparatus is an oscilloscope or a spectrum analyzer.

In some embodiments, a measurement procedure of the measurement and calculation module includes the following steps.

In S1, obtain a theoretical resonance frequency $f_T$ by using the following formula:

$$f_T = \frac{E_{Rn} - E_{R1}}{h},$$

where $E_{R1}$ is an initial energy level of a Rydberg state of an atomic vapor, $E_{Rn}$ is a final energy level of the Rydberg state of the atomic vapor after transition, and h is the Planck constant.

In S2, select a first electric field strength value $E_{x1}$, and send a RF electromagnetic signal whose electric field strength is $E_{x1}$ to the quantum sensor through the experimental signal source; and in a range of $f_T \pm 50$ MHZ, select a sweep frequency step Step1=$W_{PDH}$/2, perform coarse frequency sweep by changing a frequency of the RF electromagnetic signal, and record a frequency gap $\Delta f_m$ measured by the fast measurement module in each scanning, where $W_{PDH}$ is a minimum linewidth of an optical ultra-stable cavity in the probe laser module and the coupling laser module.

In S3, fit all sweep frequencies and frequency gap data in S2 into a curve, to obtain the lowest point of the curve as a resonance frequency $f_1$.

In S4, sequentially select a plurality of electric field strength values $E_{x2}$ to $E_{xn}$, repeat steps S2 and S3 to obtain n curves for different field strength values, and sequentially obtain resonance frequencies $f_1$ to $f_n$ of lowest points of the curves.

In S5, take an average value of the resonance frequencies $f_1$ to $f_n$ of n different electric field strength, to obtain an experimental resonance frequency $f_{Lab}$.

In S6, calculate a detuning value $\delta$ according to the following formula, to evaluate the quantum sensor:

$$f_{Lab} = \sqrt{\delta^2 + f_T^2}, \text{ where}$$

the smaller $\delta$ indicates the higher precision of the quantum sensor, and when $\delta=0$, $f_{Lab}=f_T$, and a quantum sensing function reaches resonance state.

In some embodiments, S2 further includes: in a range of $f_T \pm 20$ MHZ, selecting a sweep frequency step Step2=$W_{PDH}$/4, performing fine frequency sweep, and recording a frequency gap $\Delta fm$ measured by the fast measurement module in each scanning.

In some embodiments, n ranges from 4 to 12.

In some embodiments, n is 8.

According to a second aspect, some embodiments of the present disclosure provide a method for measuring resonance frequencies of a quantum sensor based on multi-photon excitation. The method is implemented based on the foregoing system, and includes the following steps.

In S1, obtain a theoretical resonance frequency $f_T$ by using the following formula:

$$f_T = \frac{E_{Rn} - E_{R1}}{h},$$

where $ER_1$ is an initial energy level of a Rydberg state of an atomic vapor, $E_{Rn}$ is a final energy level of the Rydberg state of the atomic vapor after transition, and h is the Planck constant.

In S2, select a first electric field strength value $E_{x1}$, and send a RF electromagnetic signal whose electric field strength is $E_{x1}$ to a quantum sensor through an experimental signal source; and in a range of $f_T \pm 50$ MHz, select a sweep frequency step Step1=$W_{PDH}$/2, perform coarse frequency sweep by changing a frequency of the RF electromagnetic signal, and record a frequency gap $\Delta f_m$ measured by a fast measurement module in each scanning, where $W_{PDH}$ is a minimum linewidth of an optical ultra-stable cavity in a probe laser module and a coupling laser module.

In S3, fit all sweep frequencies and frequency gap data in S2 into a curve, to obtain the lowest point of the curve as a resonance frequency $f_1$.

In S4, sequentially select a plurality of electric field strength values $E_{x2}$ to $E_{xn}$, repeat steps S2 to S3 to obtain n curves for different field strength values, and sequentially obtain resonance frequencies $f_1$ to $f_n$ of lowest points of the curves.

In S5, take an average value of the resonance frequencies $f_1$ to $f_n$ of n different electric field strength, to obtain an experimental resonance frequency $f_{Lab}$.

In S6, calculate a detuning value $\delta$ according to the following formula, to evaluate the quantum sensor:

$$f_{Lab} = \sqrt{\delta^2 + f_T^2}, \text{ where}$$

the smaller $\delta$ indicates the higher precision of the quantum sensor, and when $\delta=0$, $f_{Lab}=f_T$, and a quantum sensing function reaches resonance.

In some embodiments, S2 further includes: in a range of $f_T \pm 20$ MHZ, selecting a sweep frequency step Step2=$W_{PDH}$/4, performing fine frequency sweep, and recording a frequency gap $\Delta f_m$ measured by the fast measurement module in each scanning.

In some embodiments, n ranges from 4 to 12.

The system and method for measuring resonance frequencies of a quantum sensor based on multi-photon excitation that are provided in the present disclosure are featured by a simple structure, a fast and convenient operation procedure, and high measurement efficiency. In addition, scientific and quantitative measurement and evaluation can be implemented for the quantum sensor, which provides a sufficient scientific basis for a measurement result.

DESCRIPTION OF EMBODIMENTS

The following describes in detail the embodiments of the present disclosure with reference to the accompanying drawings.

Figure 1:
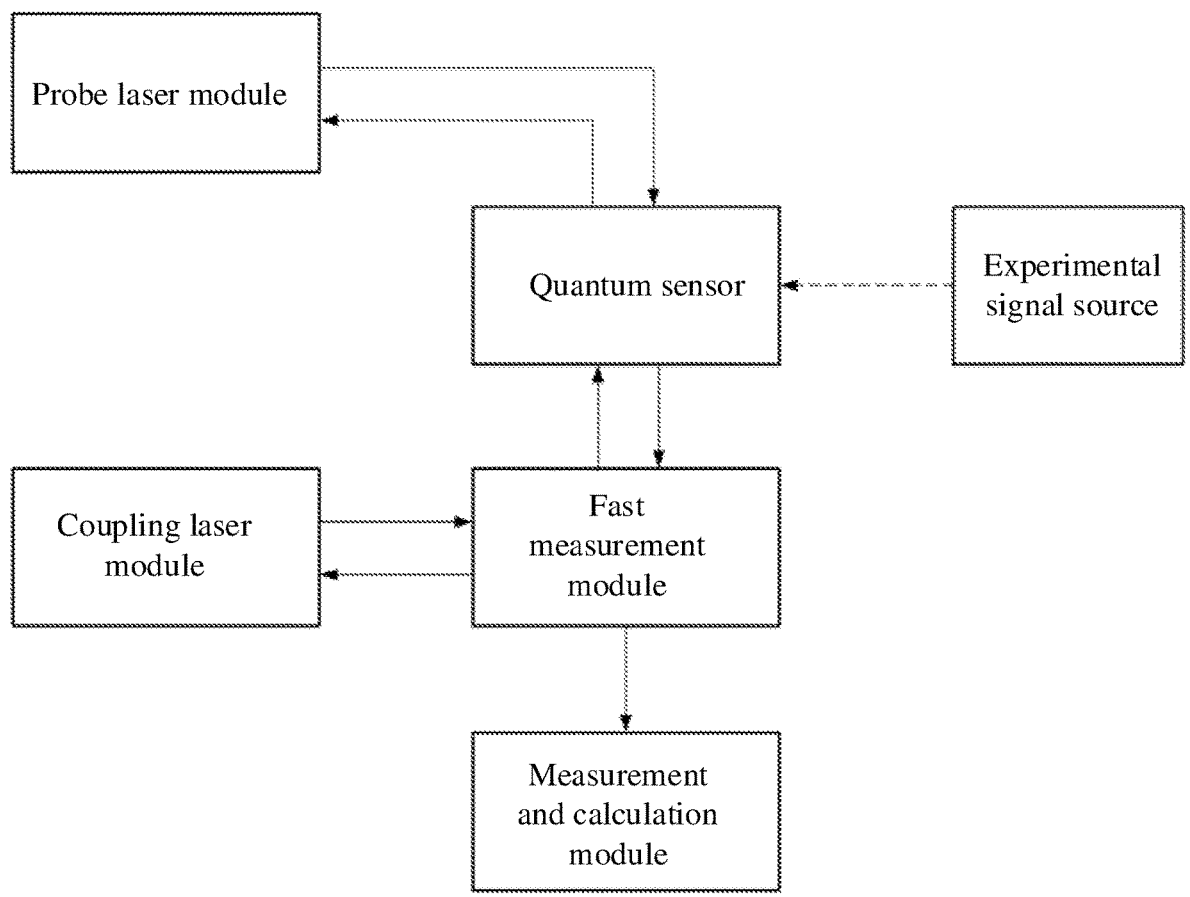
FIG. 1 is a block diagram of a system structure for measuring resonance frequencies of a quantum sensor based on multi-photon excitation according to an embodiment of the present disclosure.

As shown in FIG. 1, an embodiment of the present disclosure provides a system for measuring resonance frequencies of a quantum sensor based on multi-photon excitation. The system includes a probe laser module, a coupling laser module, a quantum sensor, a fast measurement module, an experimental signal source, and a measurement and calculation module.

The experimental signal source directly radiates the quantum sensor, and is configured to transmit a RF electromagnetic signal to the quantum sensor.

The quantum sensor includes a closed glass cavity. An alkali metal atomic vapor (which may be specifically an alkali metal atomic vapor of rubidium, cesium, or the like) is enclosed in the glass cavity. The probe laser module is connected to one side of the quantum sensor, and the coupling laser module is connected to the other side of the quantum sensor through the fast measurement module, the other side being opposite to the one side.

The coupling laser module is configured to: emit a coupling laser at a stable frequency, and transmit the coupling laser to the side of the quantum sensor through the fast measurement module.

The probe laser module is configured to: emit a probe laser at a stable frequency, and transmit the probe laser to the other side of the quantum sensor.

The quantum sensor is configured to: apply the probe laser and the coupling laser to the atomic vapor to generate an EIT signal, which can sense the RF electromagnetic signal emitted by the experimental signal source. The RF electromagnetic signals induce a splitting of the EIT signals, resulting in the emergence of two distinct peaks.

The fast measurement module is configured to receive the EIT signal generated in the quantum sensor, to obtain a frequency gap between two distinct peaks of the EIT signal corresponding to different frequencies, a splitting being induced by the RF electromagnetic signal to result in the emergence of the two distinct peaks.

The measurement and calculation module is connected to the fast measurement module, and is configured to: obtain an experimental resonance frequency of the quantum sensor by using an algorithm based on the frequency gap measured by the fast measurement module and field strength of the RF electromagnetic signal transmitted by the experimental signal source, and perform measurement on the quantum sensor by comparing a theoretical resonance frequency and the experimental resonance frequency of the quantum sensor.

Further, the fast measurement module is further configured to perform beam shaping and polarization-maintaining functions on the coupling laser in a process of transmitting the coupling laser.

Further, the fast measurement module includes a half-wave plate, a dichroic mirror, a reflecting mirror, a photo-electric transducer, and a signal measurement apparatus that are sequentially disposed. The signal measurement apparatus is an oscilloscope or a spectrum analyzer.

Figure 2:
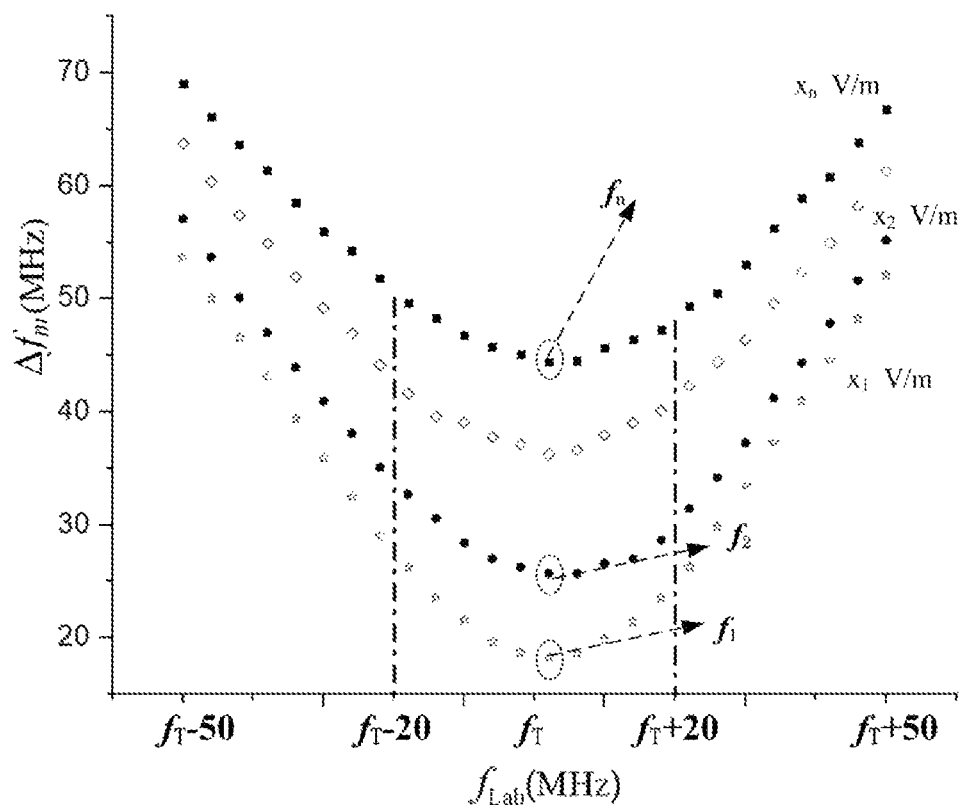
FIG. 2 is a diagram of a measurement procedure according to an embodiment of the present disclosure.

Further, as shown in FIG. 2, a measurement procedure of the measurement and calculation module includes the following steps.

In S1, obtain a theoretical resonance frequency $f_T$ by using the following formula:

$$f_T = \frac{E_{Rn} - E_{R1}}{\hbar},$$

where $E_{R1}$ is an initial energy level of a Rydberg state of the atomic vapor, $E_{Rn}$ is a final energy level of the Rydberg state of the atomic vapor after transition, and h is the Planck constant.

In S2, select a first electric field strength value $E_{x1}$=0.2 V/m, and send a RF electromagnetic signal whose electric field strength is $E_{x1}$ to the quantum sensor through the experimental signal source; in a range of $f_T$±50 MHz, select a sweep frequency step Step1=$W_{PDH}$/2, perform coarse frequency sweep by changing a frequency of the RF electromagnetic signal, and record a frequency gap $\Delta f_m$ measured by the fast measurement module in each scanning, where $W_{PDH}$ is a minimum linewidth of an optical ultra-stable cavity in the probe laser module and the coupling laser module; and in a range of $f_T$±20 MHz, select a sweep frequency step Step2=$W_{PDH}$/4, perform fine frequency sweep, and record a frequency gap $\Delta f_m$ measured by the fast measurement module in each scanning.

In S3, fit all sweep frequencies and frequency gap data in S2 into a curve, to obtain the lowest point of the curve as a resonance frequency $f_1$.

In S4, sequentially set electric field strength values from $E_{x2}$ to $E_{xn}$=0.6, 0.8, 1.2, 1.6, 2.4, 4.0, and 8.0 V/m, repeat steps S2 and S3 to obtain eight curves for different field strength values, and sequentially obtain resonance frequencies $f_1$ to $f_8$ of lowest points of the curves.

In S5, take an average value of the resonance frequencies $f_1$ to $f_n$ of eight different electric field strengths, to obtain an experimental resonance frequency $$f_{Lab} = \frac{1}{8}\sum_{n=1}^{8} f_n.$$

In S6, calculate a detuning value δ according to the following formula, to evaluate the quantum sensor:

$$f_{Lab} = \sqrt{\delta^2 + f_T^2}, \text{ where}$$

the smaller δ indicates the higher precision of the quantum sensor, and when δ=0, $f_{Lab}$=$f_T$, and a quantum sensing function reaches resonance.

Further, the present disclosure further provides a method for measuring resonance frequencies of a quantum sensor based on multi-photon excitation. The method is implemented based on the foregoing system, and includes the following steps:

In S1, obtain a theoretical resonance frequency $f_T$ by using the following formula:

$$f_T = \frac{E_{Rn} - E_{R1}}{\hbar},$$

where $E_{R1}$ is an initial energy level of a Rydberg state of an atomic vapor, $E_{Rn}$ is a final energy level of the Rydberg state of the atomic vapor after transition, and h is the Planck constant.

In S2, select the first electric field strength value $E_{x1}$, and send a RF electromagnetic signal whose electric field strength is $E_{x1}$ to a quantum sensor through an experimental signal source; and in a range of $f_T$±50 MHz, select a sweep frequency step Step1=$W_{PDH}$/2, perform coarse frequency sweep by changing a frequency of the RF electromagnetic signal, and record a frequency gap $\Delta f_m$ measured by a fast measurement module in each scanning, where $W_{PDH}$ is a minimum linewidth of an optical ultra-stable cavity in a probe laser module and a coupling laser module.

In S3, fit all sweep frequencies and frequency gaps data in S2 into a curve, to obtain the lowest point of the curve as a resonance frequency $f_1$.

In S4, sequentially select a plurality of electric field strength values $E_{x2}$ to $E_{xn}$, repeat steps S2 to S3 to obtain n curves for different field strength values, and sequentially obtain resonance frequencies $f_1$ to $f_n$ of lowest points of the curves.

In S5, take an average value of the resonance frequencies $f_1$ to $f_n$ of n different electric field strength, to obtain an experimental resonance frequency $f_{Lab}$.

In S6, calculate a detuning value $\delta$ according to the following formula, to evaluate the quantum sensor:

$f_{Lab} = \sqrt{\delta^2 + f_T^2}$, where the smaller $\delta$ indicates the higher precision of the quantum sensor, and when $\delta=0$, $f_{Lab}=f_T$, and a quantum sensing function reaches resonance.

Further, S2 further includes: in a range of $f_T \pm 20$ MHz, selecting a sweep frequency step Step2=$W_{PDH}/4$, performing fine frequency sweep, and recording a frequency gap $\Delta f_m$ measured by the fast measurement module in each scanning.

Further, n ranges from 4 to 12.

The system and method for measuring resonance frequencies of a quantum sensor based on multi-photon excitation that are provided in the present disclosure are featured by a simple structure, a fast and convenient operation procedure, and high measurement efficiency. In addition, scientific and quantitative measurement and evaluation can be implemented for the quantum sensor, which provides a sufficient scientific basis for a measurement result.

The foregoing embodiments only represent several implementations of the present disclosure, and descriptions thereof are specific and detailed, but should not be construed as a limitation on the patent scope of the present disclosure. It should be noted that those of ordinary skills in the art may further make several modifications and improvements without departing from the concept of the present disclosure, and these modifications and improvements also fall within the protection scope of the present disclosure. Therefore, the protection scopes of the present disclosure should be subject to the appended claims.

What is claimed is:

1. A system for measuring resonance frequencies of a quantum sensor based on multi-photon excitation, comprising a probe laser module, a coupling laser module, a quantum sensor, a fast measurement module, an experimental signal source, and a measurement and calculation module, wherein the experimental signal source directly radiates the quantum sensor, and is configured to transmit a RF electromagnetic signal to the quantum sensor;

the quantum sensor comprises a closed glass cavity, and an alkali metal atomic vapor is enclosed in the glass cavity; and the probe laser module is connected to a first side of the quantum sensor, and the coupling laser module is connected to a second side of the quantum sensor through the fast measurement module, the second side being opposite to the first side;

the coupling laser module is configured to: emit a coupling laser at a stable frequency, and transmit the coupling laser to the second side of the quantum sensor through the fast measurement module;

the probe laser module is configured to: emit a probe laser at a stable frequency, and transmit the probe laser to the first side of the quantum sensor;

the quantum sensor is configured to: apply the probe laser and the coupling laser to the atomic vapor to generate an EIT signal, which senses the RF electromagnetic signal emitted by the experimental signal source, the RF electromagnetic signals inducing a splitting of the EIT signals, resulting in an emergence of two distinct peaks;

the fast measurement module is configured to receive the EIT signal generated in the quantum sensor, to obtain a frequency gap between two distinct peaks of the EIT signal corresponding to different frequencies, a splitting being induced by the RF electromagnetic signal to result in the emergence of the two distinct peaks; and the measurement and calculation module is connected to the fast measurement module, and is configured to: obtain an experimental resonance frequency of the quantum sensor by using an algorithm based on the frequency gap measured by the fast measurement module and field strength of the RF electromagnetic signal transmitted by the experimental signal source, and perform measurement on the quantum sensor by comparing a theoretical resonance frequency and the experimental resonance frequency of the quantum sensor, wherein a measurement procedure of the measurement and calculation module comprises following steps:

in S1, obtaining a theoretical resonance frequency $f_T$ by using the following formula:

$$f_T = \frac{E_{Rn} - E_{R1}}{\hbar},$$

wherein $E_{R1}$ is an initial energy level of a Rydberg state of the atomic vapor, $E_{Rn}$ is a final energy level of the Rydberg state of the atomic vapor after transition, and h is the Planck constant;

in S2, selecting a first electric field strength value $E_{x1}$, and sending a RF electromagnetic signal whose electric field strength is Ex to the quantum sensor through the experimental signal source;

and in a range of $f_T \pm 50$ MHz, selecting a sweep frequency step Step1=$W_{PDH}/2$, performing coarse frequency sweep by changing a frequency of the RF electromagnetic signal, and recording a frequency gap $\Delta f_m$ measured by the fast measurement module in each scanning, wherein $W_{PDH}$ is a minimum linewidth of an optical ultra-stable cavity in the probe laser module and the coupling laser module;

in S3, fitting all sweep frequencies and frequency gap data in S2 into a curve, to obtain the lowest point of the curve as a resonance frequency $f_1$;

in S4, sequentially selecting a plurality of electric field strength values $E_{x2}$ to $E_{xn}$, repeating steps S2 and S3 to obtain n curves for different field strength values, and sequentially obtaining resonance frequencies $f_1$ to $f_n$ of lowest points of the curves;

in S5, taking an average value of the resonance frequencies $f_1$ to $f_n$ of n different electric field strength, to obtain an experimental resonance frequency $f_{Lab}$; and in S6, calculating a detuning value $\delta$ according to the following formula, to evaluate the quantum sensor:

$f_{Lab} = \sqrt{\delta^2 + f_T^2}$, wherein a smaller δ indicates a higher precision of the quantum sensor, and when δ=0, $f_{Lab}=f_T$, and a quantum sensing function reaches resonance.

2. The system for measuring resonance frequencies of a quantum sensor based on multi-photon excitation according to claim 1, wherein the fast measurement module is further configured to perform beam shaping and polarization-maintaining functions on the coupling laser in a process of transmitting the coupling laser.

3. The system for measuring resonance frequencies of a quantum sensor based on multi-photon excitation according to claim 1, wherein the fast measurement module comprises a half-wave plate, a dichroic mirror, a reflecting mirror, a photoelectric transducer, and a signal measurement apparatus that are sequentially disposed, and the signal measurement apparatus is an oscilloscope or a spectrum analyzer.

4. The system for measuring resonance frequencies of a quantum sensor based on multi-photon excitation according to claim 1, wherein S2 further comprises: in a range of $f_T\pm 20$ MHz, selecting a sweep frequency step Step2=$W_{PDH}/4$, performing fine frequency sweep, and recording a frequency gap $\Delta f_m$ measured by the fast measurement module in each scanning.

5. The system for measuring resonance frequencies of a quantum sensor based on multi-photon excitation according to claim 1, wherein n ranges from 4 to 12.

6. The system for measuring resonance frequencies of a quantum sensor based on multi-photon excitation according to claim 5, wherein n is 8.

7. A method for measuring resonance frequencies of a quantum sensor based on multi-photon excitation, implemented based on the system according to any one of claims 1 to 6, comprising the following steps:

in S1, obtaining a theoretical resonance frequency $f_T$ by using the following formula:

$$f_T = \frac{E_{Rn} - E_{R1}}{\hbar},$$

wherein $E_{R1}$ is an initial energy level of a Rydberg state of an atomic vapor, $E_{Rn}$ is a final energy level of the Rydberg state of the atomic vapor after transition, and h is the Planck constant;

in S2, selecting a first electric field strength value $E_{x1}$, and sending a RF electromagnetic signal whose electric field strength is $E_{x1}$ to a quantum sensor through an experimental signal source; and in a range of $f_T\pm 50$ MHz, selecting a sweep frequency step Step1=$W_{PDH}/2$, performing coarse frequency sweep by changing a frequency of the RF electromagnetic signal, and recording a frequency gap $\Delta f_m$ measured by a fast measurement module in each scanning, wherein $W_{PDH}$ is a minimum linewidth of an optical ultra-stable cavity in a probe laser module and a coupling laser module;

in S3, fitting all sweep frequencies and frequency gap data in S2 into a curve, to obtain the lowest point of the curve as a resonance frequency $f_1$;

in S4, sequentially selecting a plurality of electric field strength values $E_{x2}$ to $E_{xn}$, repeating steps S2 and S3 to obtain n curves for different field strength values, and sequentially obtaining resonance frequencies $f_1$ to $f_n$ of lowest points of the curves;

in S5, taking an average value of the resonance frequencies $f_1$ to $f_n$ of n different electric field strength, to obtain an experimental resonance frequency $f_{Lab}$, and in S6, calculating a detuning value δ according to the following formula, to evaluate the quantum sensor:

$f_{Lab}=\sqrt{\delta^2+f_T^2}$, wherein a smaller δ indicates a higher precision of the quantum sensor, and when δ=0, $f_{Lab}=f_T$, and a quantum sensing function reaches resonance.

8. The method for measuring resonance frequencies of a quantum sensor based on multi-photon excitation according to claim 7, wherein S2 further comprises: in a range of $f_T\pm 20$ MHz, selecting a sweep frequency step Step2=$W_{PDH}/4$, performing fine frequency sweep, and recording a frequency gap $\Delta f_m$ measured by the fast measurement module in each scanning.

9. The method for measuring resonance frequencies of a quantum sensor based on multi-photon excitation according to claim 8, wherein n ranges from 4 to 12.

* * * * *